(12) United States Patent
Chien

(10) Patent No.: US 9,210,798 B2
(45) Date of Patent: Dec. 8, 2015

(54) WIRELESS MODULE

(71) Applicant: Sercomm Corporation, Taipei (TW)

(72) Inventor: Yuan-Fu Chien, Taipei (TW)

(73) Assignee: SERCOMM CORPORATION, Taipei (TW)

( * ) Notice: Subject to any disclaimer, the term of this patent is extended or adjusted under 35 U.S.C. 154(b) by 177 days.

(21) Appl. No.: 14/054,961

(22) Filed: Oct. 16, 2013

(65) Prior Publication Data

US 2014/0185249 A1 Jul. 3, 2014

Related U.S. Application Data

(60) Provisional application No. 61/746,612, filed on Dec. 28, 2012.

(30) Foreign Application Priority Data

Jul. 3, 2013 (CN) ...................... 2013 2 0393242 U

(51) Int. Cl.
*H05K 1/14* (2006.01)
*H05K 1/02* (2006.01)
*H05K 5/02* (2006.01)
*H05K 1/16* (2006.01)
*H05K 1/18* (2006.01)

(52) U.S. Cl.
CPC ............ *H05K 1/0216* (2013.01); *H05K 1/0243* (2013.01); *H05K 5/0278* (2013.01); *H05K 1/165* (2013.01); *H05K 1/181* (2013.01); *H05K 2201/10098* (2013.01); *H05K 2201/10189* (2013.01); *H05K 2201/10371* (2013.01)

(58) Field of Classification Search
CPC ......................................................... H05K 1/14
USPC ......................................................... 361/785
See application file for complete search history.

(56) References Cited

U.S. PATENT DOCUMENTS

| | | | | |
|---|---|---|---|---|
| 5,855,988 A | * | 1/1999 | Matsuo | ...................... 428/195.1 |
| 6,441,698 B1 | * | 8/2002 | Matsutani et al. | .......... 333/81 B |
| 6,884,936 B2 | * | 4/2005 | Takahashi et al. | ............. 174/389 |
| 7,242,507 B2 | * | 7/2007 | Yen | ................... 359/244 |
| 7,615,281 B2 | * | 11/2009 | Yamamoto et al. | ............ 428/328 |
| 7,940,146 B2 | * | 5/2011 | Oda | ................... 333/193 |
| 7,973,724 B2 | * | 7/2011 | Shan et al. | ..................... 343/702 |
| 2008/0084259 A1 | * | 4/2008 | Yoshida et al. | ............... 333/243 |
| 2011/0183133 A1 | * | 7/2011 | Osada et al. | .................. 428/220 |
| 2014/0154469 A1 | * | 6/2014 | Kagawa | ........................ 428/155 |

\* cited by examiner

*Primary Examiner* — Forrest M Phillips
(74) *Attorney, Agent, or Firm* — McClure, Qualey & Rodack, LLP

(57) ABSTRACT

An embodiment of the present invention provides a wireless module comprising a circuit board module, a USB connector and a wave absorbing film. The USB connector is connected to the circuit board module. The wave absorbing film is disposed on the circuit board module and is extended to overlap at least a part of the USB connector. In addition, a wave-absorbing cavity is formed between the wave absorbing film and the USB connector.

13 Claims, 4 Drawing Sheets

WIRELESS MODULE

This application claims the benefit of U.S. provisional application Ser. No. 61/746,612, filed on Dec. 28, 2012, and claims the benefit of People's Republic of China application Serial No. 201320393242.2, filed on Jul. 3, 2013, the subject matters of which are incorporated herein by reference.

BACKGROUND

1. Field of the Invention

The invention relates in general to a wireless module, and more particularly to a wave-absorbing wireless module.

2. Related Art

As the amount of information that needs to be processed keeps growing along with the advance in technology, the transmission rate of signals also becomes faster and faster. Let USB 3.0 connector be taken for example. The USB 3.0 connector has a bandwidth of 5 Gbps and has a transmission rate 10 times faster than that of USB 2.0 connector, hence greatly saving transmission time and power consumption. However, due to high-speed transmission, the USB 3.0 connector may easily radiate noises which affect the operation of the USB 3.0 connector itself or electronic components nearby.

SUMMARY OF THE INVENTION

According to one embodiment of the present invention, a wireless module is provided. The wireless module comprises a circuit board module, a USB connector and a wave absorbing film. The USB connector is connected to the circuit board module. The wave absorbing film is disposed on the circuit board module and is extended to overlap at least a part of the USB connector. In addition, a wave-absorbing cavity is formed between the wave absorbing film and the USB connector.

The above and other aspects of the invention will become better understood with regard to the following detailed description of the embodiment(s). The following description is made with reference to the accompanying drawings.

DETAILED DESCRIPTION OF THE INVENTION

Figure 1:
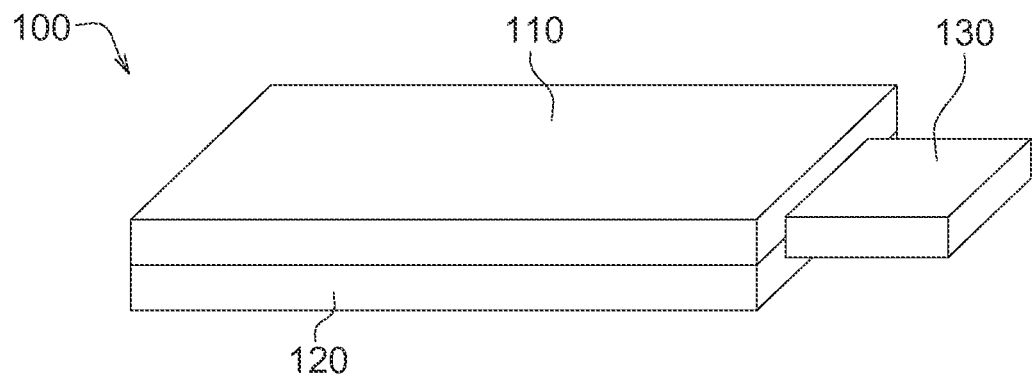
FIG. 1 is an appearance diagram of a wireless module according to an embodiment of the present invention.
Figure 2:
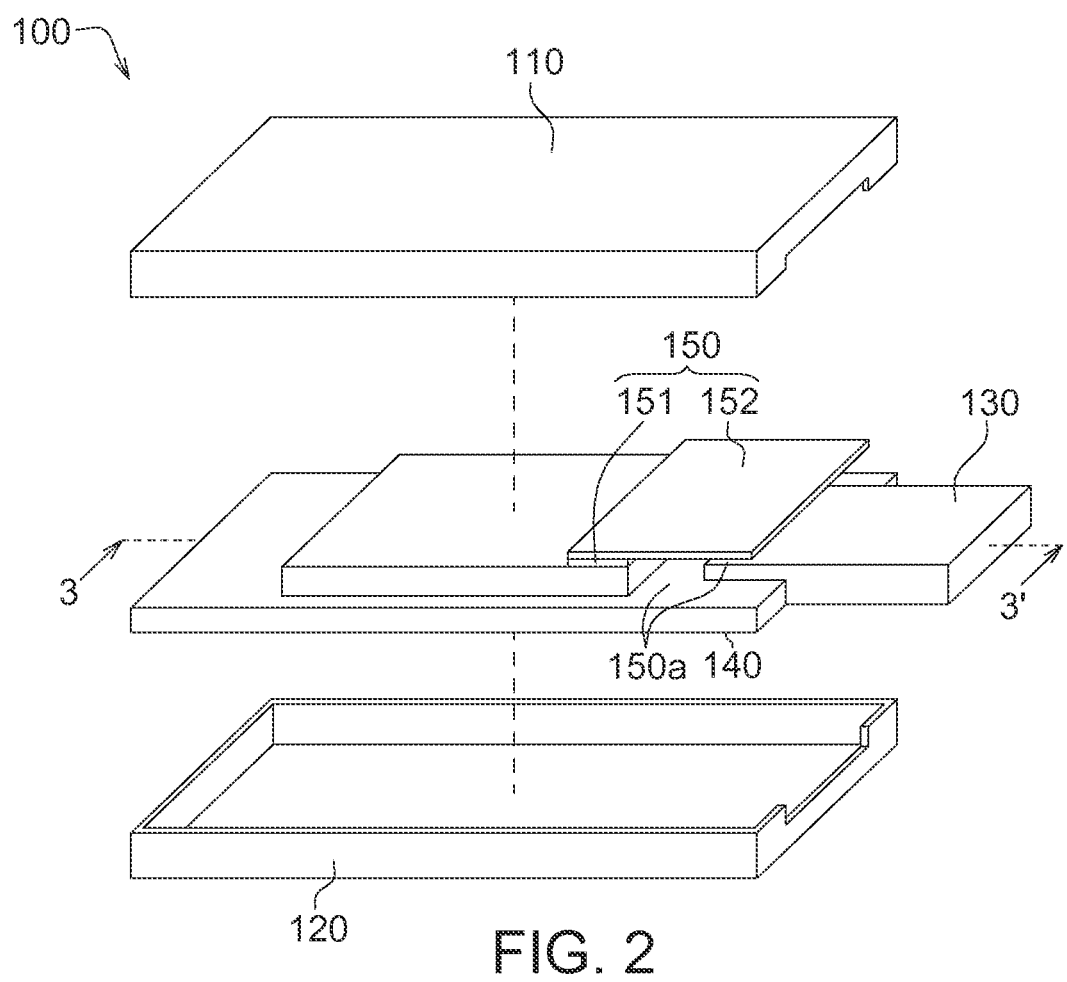
FIG. 2 is an explosion diagram of the wireless module of FIG. 1.

Referring to FIG. 1 and FIG. 2. FIG. 1 is an appearance diagram of a wireless module according to an embodiment of the present invention. FIG. 2 is an explosion diagram of the wireless module of FIG. 1. The wireless module 100 is such as a WiFi dongle, and may have a bandwidth of wireless signal ranging between 2~7.5 GHz, a range above 7.5 GHz or a range below 2 GHz. The wireless module 100 comprises an upper cover 110, a lower cover 120, a universal serial bus (USB) connector 130, a circuit board module 140 and a wave absorbing film 150.

The upper cover 110 and the lower cover 120 cover the circuit board module 140, the wave absorbing film 150, and a part of the USB connector 130, and provide protection to the covered components.

The USB connector 130 is connected to one terminal of the circuit board module 140. In the present example, the USB connector 130 is conformed to USB 3.0 specification. During the operation of the wireless module 100 using USB 3.0 specification, the noise N1 (FIG. 3) generated by the USB connector 130 will interfere with the wireless signal ranging between 2.4 GHz and 5 GHz, and further affect signal quality. The wave absorbing film 150 of the present invention absorbs the noise N1 generated by the USB connector 130 so that signal quality can be maintained or even improved. In another example, the USB connector 130 can be conformed to other USB specification such as USB 2.0 specification.

Figure 3:
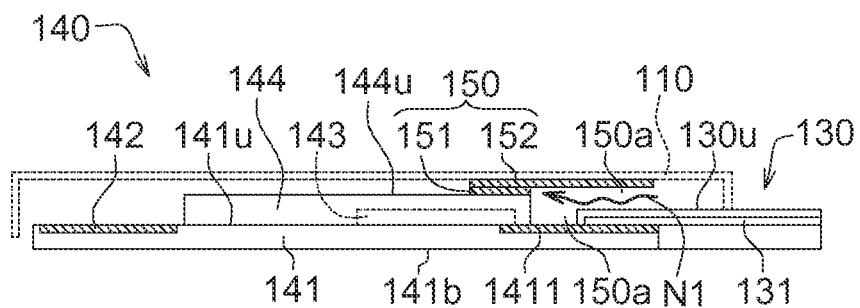
FIG. 3 is a cross-sectional view along direction 3-3 of FIG. 2.

Referring to FIG. 3, a cross-sectional view along direction 3-3' of FIG. 2 is shown. The circuit board module 140 comprises a printed circuit board (PCB) 141, an antenna 142, a wireless chip 143 and a shielding cover 144. The antenna 142 is formed on the PCB 141. The wireless chip 143, such as a Wi-Fi wireless chip or other chips using wireless technology, is disposed on the PCB 141, and is electrically connected to the antenna 142 through traces (not illustrated) to receive a signal from the antenna 142 and/or transmit a signal to the antenna 142. The shielding cover 144 is disposed on the PCB 141 and covers the wireless chip 143. Since the shielding cover 144 is grounded, the wireless chip 143 will be less affected by or immune from electromagnetic interference (EMI).

The wave absorbing film 150 is formed by a wave-absorbing material and is capable of absorbing radiated noises. The wave absorbing film 150 is disposed on the circuit board module 140 and is extended to overlap at least a part of the USB connector 130. In addition, a wave-absorbing cavity 150a is formed between the wave absorbing film 150 and the USB connector 130. That is, the wave absorbing film 150 overlaps a part of the upper surface 130u of the USB connector 130 through the wave-absorbing cavity 150a and covers a part of the pin 131 of the USB connector 130. In another example, the wave absorbing film 150 overlaps the entire upper surface 130u of the USB connector 130 through the wave-absorbing cavity 150a and covers the entire pin 131 of the USB connector 130. Since the noise N1 can be radiated from the pin 131, the larger the overlapping area between the wave absorbing film 150 and the pin 131 is, the larger the amount of noise N1 will be absorbed. Besides, the pin 131 is connected to the traces 1411 of the PCB 141 so as to be electrically connected to the wireless chip 143.

The wave absorbing film 150 is disposed on an upper surface 144u of the shielding cover 144. In the present example, the wave absorbing film 150 comprises a first wave absorbing sub-film 151 and a second wave absorbing sub-film 152. The first wave absorbing sub-film 151 is adhered onto the shielding cover 144 of the circuit board module 140, and the second wave absorbing sub-film 152 is adhered onto an upper surface of the first wave absorbing sub-film 151. In the present example, the first wave absorbing sub-film 151 and the second wave absorbing sub-film 152 are adhesive by themselves or through an adhesive material such as glue or tape.

After the upper cover 110 is assembled to the circuit board module 140, the upper cover 110 presses on the second wave absorbing sub-film 152, such that no gap is formed between the upper cover 110 and the second wave absorbing sub-film 152. Accordingly, the noise N1 will not be radiated off the wave-absorbing cavity 150a via any gap between the upper cover 110 and the second wave absorbing sub-film 152 to interfere with circuit components inside or outside the wireless module 100.

Due to the design of the wave absorbing film 150, the wireless module 100 plugged into an electronic device (not illustrated) such as a notebook computer is also capable of absorbing noises of the electronic device.

Figure 4:
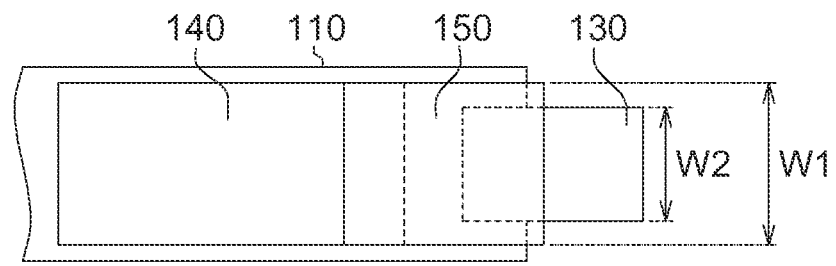
FIG. 4 is a top view of the wireless module of FIG. 2.

Referring to FIG. 4, a top view of the wireless module of FIG. 2 is shown. The width W1 of the wave absorbing film 150 is larger an or equal to the width W2 of the USB connector 130, such that the wave absorbing film 150 covers the noise N1 generated by the USB connector 130 in the width direction. In another example, the width W1 of the wave absorbing film 150 can be less than the width W2 of the USB connector 130.

In the above embodiment, the wave absorbing film 150 is located beside the upper surface of 141u of the PCB 141 (FIG. 3). In another example, the wave absorbing film 150 can be located beside the lower surface of 141b of the PCB 141 (FIG. 3). Or, two wave absorbing films 150 are respectively located besides the upper surface 141u and the lower surface 141b of the PCB 141.

Figure 5:
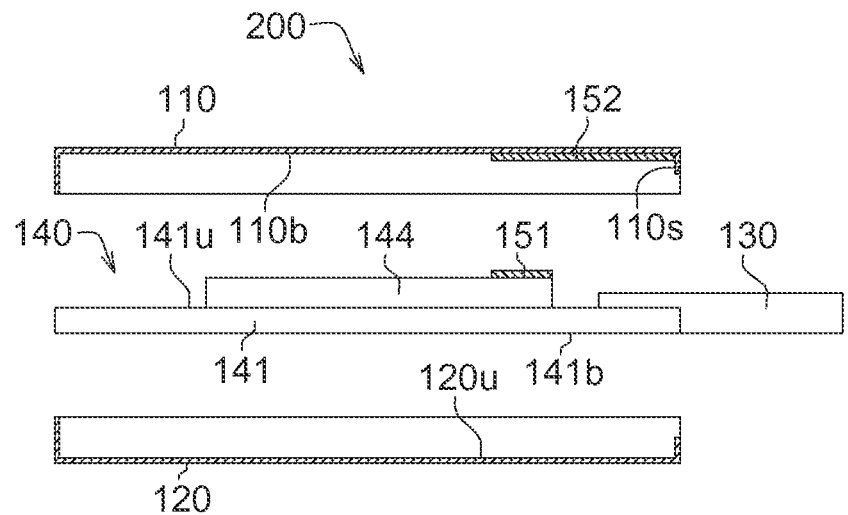
FIG. 5 is an explosion diagram of a wireless module according to another embodiment of the present invention.

Referring to FIG. 5, an explosion diagram of a wireless module according to another embodiment of the present invention is shown. The wireless module 200 is such as a WiFi dongle, and may have a bandwidth of wireless signal ranging between 2~7.5 GHz, a range above 7.5 GHz or a range below 2 GHz. The wireless module 200 comprises an upper cover 110, a lower cover 120, a universal serial bus (USB) connector 130, a circuit board module 140 and a wave absorbing film 150.

In the present example, the first wave absorbing sub-film 151 is adhered onto the shielding cover 144 of the circuit board module 140, and the second wave absorbing sub-film 152 is adhered onto the lower surface 110b of the upper cover 110. After the upper cover 110 is assembled to the circuit board module 140, the second wave absorbing sub-film 152 presses on the first wave absorbing sub-film 151, such that no gap is formed between the upper cover 110 and the second wave absorbing sub-film 152. Without such a gap, no or less noise N1 (not illustrated in FIG. 5) will be radiated off the wave-absorbing cavity 150a to interfere with circuit components inside or outside the wireless module 100.

As indicated in FIG. 5, the second wave absorbing sub-film 152 is adhered onto the lower surface 110b of the upper cover 110 and is extended to an inner lateral side 110s of the upper cover 110 to cover as large part of the USB connector 130 as possible.

In another example, the first wave absorbing sub-film 151 can be adhered onto the lower surface 141b of the PCB 141, and the second wave absorbing sub-film 152 can be adhered onto the upper surface 120u of the lower cover 120. Or, two first wave absorbing sub-films 151 are respectively adhered onto the lower surface 141b of the PCB 141 and the upper surface of 144u of the shielding cover 144 (FIG. 3), and two second wave absorbing sub-films 152 are respectively adhered onto the lower surface 110b of the upper cover 110 and the upper surface 120u of the lower cover 120.

Figure 6:
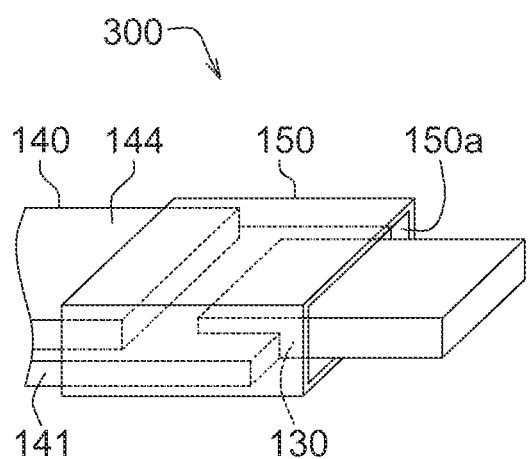
FIG. 6 is an appearance diagram of a wireless module according to another embodiment of the present invention.

Referring to FIG. 6, an appearance diagram of a wireless module according to another embodiment of the present invention is shown. The wireless module 300 is such as a WiFi dangle, and may have a bandwidth of wireless signal ranging between 2~7.5 GHz, a range above 7.5 GHz or a range below 2 GHz. The wireless module 300 comprises an upper cover 110 (not illustrated in the diagram), a lower cover 120 (not illustrated in the diagram), a USB connector 130, a circuit board module 140 and a wave absorbing film 150. In the present example, the wave absorbing film 150 is adhered onto the shielding cover 144 of the circuit board module 140 and surrounds a part of the USB connector 130. That is, the wave absorbing film 150 of the present example is a closed ring-shaped wave absorbing film surrounding a part of the upper surface, a part of the lower surface, and a part of two side surfaces of the USB connector 130. In another example, the wave absorbing film 150 can entirely surround the upper surface, the lower surface and the two opposite side surfaces of the USB connector 130.

Figure 7:
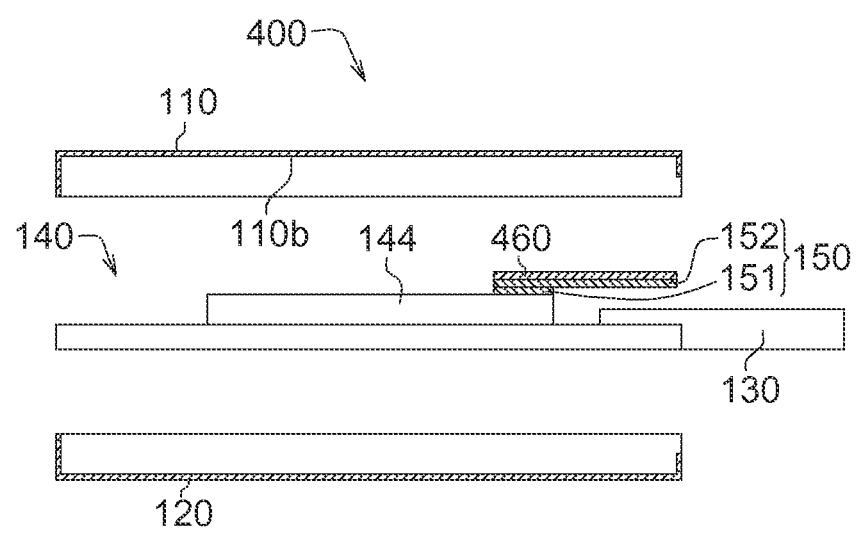
FIG. 7 is a cross-sectional view of a wireless module according to another embodiment of the present invention.

Referring to FIG. 7, a cross-sectional view of a wireless module according to another embodiment of the present invention is shown. The wireless module 400 comprises a protection cover (the upper cover 110 and the lower cover 120), a USB connector 130, a circuit board module 140, a wave absorbing film 150 and a conductive layer 460. The upper cover 110 covers the wave absorbing film 150. The conductive layer 460 is disposed between the wave absorbing film 150 and the upper cover 110 to increase effect on electromagnetic interference shielding.

In the present example, the conductive layer 460 is a copper layer, or a copper film in particularly, can be pre-adhered onto the wave absorbing film 150 or the lower surface 110b of the upper cover 110. The conductive layer 460 can be realized by materials such as aluminum, copper, chromium, tin, gold, silver, nickel or other suitable conductive materials. In another example, the conductive layer 460 can be realized by a conductive paint pre-formed on the wave absorbing film 150 or the lower surface 110b of the upper cover 110 by using coating technology.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wireless module, comprising:
  a circuit board module;
  a universal serial bus (USB) connector connected to the circuit board module; and
  a wave absorbing film disposed on the circuit board module and extended to overlap at least a part of the USB connector, wherein a wave-absorbing cavity is formed between the wave absorbing film and the USB connector.

2. The wireless module according to claim 1, wherein the circuit board module comprises:
  a printed circuit board (PCB);
  an antenna formed on the PCB;
  a wireless chip disposed on the PCB; and
  a shielding cover disposed on the PCB and covering the wireless chip;
  wherein the wave absorbing film is disposed on an upper surface of the shielding cover.

3. The wireless module according to claim 1, wherein the wave absorbing film comprises:
  a first wave absorbing sub-film disposed on the circuit board module; and
  a second wave absorbing sub-film disposed on the first wave absorbing sub-film.

4. The wireless module according to claim 3, further comprising:
   a protection cover pressing on the second wave absorbing sub-film.

5. The wireless module according to claim 1, wherein a width of the wave absorbing film is larger than or equal to that of the USB connector.

6. The wireless module according to claim 1, further comprising a protection cover, wherein the wave absorbing film comprises:
   a first wave absorbing sub-film disposed on the circuit board module; and
   a second wave absorbing sub-film disposed on the protection cover, wherein the protection cover presses on the first wave absorbing sub-film through the second wave absorbing sub-film.

7. The wireless module according to claim 1, wherein the wave absorbing film surrounds a part of the USB connector.

8. The wireless module according to claim 1, wherein the wave absorbing film surrounds the entire USB connector.

9. The wireless module according to claim 1, wherein the USB connector is conformed to USB 3.0 specification.

10. The wireless module according to claim 1, further comprising:
    an upper cover; and
    a lower cover;
    wherein the wireless module comprises two wave absorbing films each comprising a first wave absorbing sub-film and a second wave absorbing sub-film, the two first wave absorbing sub-films are respectively disposed on two opposite sides of the circuit board module, and the two second wave absorbing sub-films are respectively disposed on a lower surface of the upper cover and an upper surface of the lower cover.

11. The wireless module according to claim 1, further comprising:
    a protection cover covering the wave absorbing film; and
    a conductive layer disposed between the wave absorbing film and the protection cover.

12. The wireless module according to claim 11, wherein the conductive layer is a copper layer or a conductive paint.

13. The wireless module according to claim 11, wherein the conductive layer is pre-formed on the wave absorbing film or a lower surface of the protection cover.

\* \* \* \* \*